US007897920B2

(12) United States Patent
Kierse et al.

(10) Patent No.: US 7,897,920 B2
(45) Date of Patent: Mar. 1, 2011

(54) RADIATION SENSOR DEVICE AND METHOD

(75) Inventors: Oliver Kierse, Co Clare (IE); Eamon Hynes, Limerick (IE)

(73) Assignee: Analog Devices, Inc., Norwood, MA (US)

( * ) Notice: Subject to any disclaimer, the term of this patent is extended or adjusted under 35 U.S.C. 154(b) by 183 days.

(21) Appl. No.: 11/436,245

(22) Filed: May 18, 2006

(65) Prior Publication Data

US 2007/0063145 A1 Mar. 22, 2007

Related U.S. Application Data

(60) Provisional application No. 60/719,127, filed on Sep. 21, 2005.

(51) Int. Cl.
*G01T 1/24* (2006.01)
(52) U.S. Cl. .................................................. 250/338.1
(58) Field of Classification Search ............. 250/338.4, 250/239, 370.14, 353, 352
See application file for complete search history.

(56) References Cited

U.S. PATENT DOCUMENTS

| | | | | |
|---|---|---|---|---|
| 4,760,440 A | | 7/1988 | Bigler et al. ................... | 357/74 |
| 4,994,664 A | | 2/1991 | Veldkamp ................... | 250/216 |
| 5,072,283 A | * | 12/1991 | Bolger ........................ | 257/676 |
| 5,701,008 A | * | 12/1997 | Ray et al. ................... | 250/352 |
| 5,869,883 A | * | 2/1999 | Mehringer et al. .......... | 257/667 |
| 6,236,046 B1 | | 5/2001 | Watabe et al. ............. | 250/338.1 |
| 6,376,769 B1 | * | 4/2002 | Chung ........................ | 174/524 |
| 6,465,786 B1 | | 10/2002 | Rhodes ..................... | 250/338.4 |
| 6,566,745 B1 | | 5/2003 | Beyne et al. ................ | 257/680 |
| 6,646,289 B1 | | 11/2003 | Badehi ........................ | 257/81 |
| 6,751,420 B1 | | 6/2004 | Kienzle et al. .............. | 398/135 |
| 6,844,606 B2 | | 1/2005 | Logsdon et al. ............. | 257/434 |
| 6,879,035 B2 | | 4/2005 | Syllaios et al. .............. | 257/704 |
| 6,893,564 B2 | | 5/2005 | Felton et al. | |
| 6,893,574 B2 | * | 5/2005 | Felton et al. .................... | 216/2 |
| 7,115,961 B2 | * | 10/2006 | Watkins et al. .............. | 257/433 |

(Continued)

FOREIGN PATENT DOCUMENTS

EP          0 664 554 B1     12/1998

(Continued)

OTHER PUBLICATIONS

Hock et al., "Development of Transfer Molding Technology for Package with Die Active Side Partially Exposed", IEEE 2003 Electronic Components ad Technology Conference, pp. 365-372.

(Continued)

*Primary Examiner*—David P Porta
*Assistant Examiner*—Djura Malevic
(74) *Attorney, Agent, or Firm*—Sunstein Kann Murphy & Timbers LLP

(57) ABSTRACT

An improved radiation sensor device includes a cap attached to an integrated circuit chip which has a radiation sensor on a surface with a cap spaced from and covering the radiation sensor; the cap and integrated circuit chip with radiation sensor are encapsulated in an encapsulant with a transparent portion of at least one of the cap and integrated circuit chip proximate the radiation sensor being exposed at the boundary of the encapsulant.

28 Claims, 7 Drawing Sheets

U.S. PATENT DOCUMENTS

| | | | |
|---|---|---|---|
| 7,326,932 B2 * | 2/2008 | Hynes et al. | 250/353 |
| 7,329,871 B2 | 2/2008 | Fan et al. | 250/353 |
| 2002/0006687 A1 | 1/2002 | Lam | 438/118 |
| 2002/0037026 A1 * | 3/2002 | Sato et al. | 374/132 |
| 2002/0037633 A1 * | 3/2002 | Satou et al. | 438/476 |
| 2003/0128813 A1 | 7/2003 | Appleby et al. | 378/147 |
| 2003/0193018 A1 * | 10/2003 | Tao et al. | 250/239 |
| 2004/0077118 A1 | 4/2004 | Prior | 438/51 |
| 2004/0211901 A1 | 10/2004 | Syllaios et al. | 250/339.02 |
| 2005/0104187 A1 | 5/2005 | Polsky et al. | 257/690 |
| 2005/0186705 A1 | 8/2005 | Jackson et al. | 438/106 |
| 2006/0016995 A1 | 1/2006 | Kummer et al. | 250/338.1 |
| 2006/0033833 A1 | 2/2006 | Hurwitz et al. | 348/340 |
| 2006/0061889 A1 | 3/2006 | Tan et al. | 359/820 |
| 2006/0118721 A1 * | 6/2006 | Antoszewski et al. | 250/338.4 |
| 2006/0163453 A1 | 7/2006 | Hynes et al. | |
| 2006/0266938 A1 * | 11/2006 | Abela | 250/239 |
| 2007/0108635 A1 | 5/2007 | Youn | 257/787 |
| 2007/0166867 A1 | 7/2007 | Chow et al. | 438/65 |
| 2007/0292982 A1 | 12/2007 | Holloway et al. | 438/64 |

FOREIGN PATENT DOCUMENTS

| | | | |
|---|---|---|---|
| JP | 05157625 A * | 6/1993 | |
| JP | 6249708 | 9/1994 | |
| JP | 06249708 A * | 9/1994 | |
| JP | 2003270047 A * | 9/2003 | |
| WO | WO 2004/015783 A1 | 2/2004 | |

OTHER PUBLICATIONS

G.R. Lahiji and Kensall D. Wise, "A Batch-Fabricated Silicon Thermopile Infrared Detector," *IEEE Transactions on Electron Devices*, vol. ED-29(1), pp. 14-22 (Jan. 1982).

Office Action dated Dec. 4, 2008; U.S. Appl. No. 12/004,780.

Authorized Officer: Blaine R. Copenheaver, International Search Report, and Written Opinion of the International Searching Authority, PCT/US06/36666, May 25, 2007 [practitioner's file 2906/117WO].

Authorized Officer: Simin Baharlou, International Preliminary Report on Patentability, PCT/US06/36666, Mar. 26, 2008 [practitioner's file 2906/117W0].

Authorized Officer: Blaine R. Copenheaver, International Search Report, and Written Opinion of the International Searching Authority, PCT/US2007/026253, May 23, 2008 [practitioner's file 2906/120WO].

Authorized Officer: Yoshiko Kurahawa, International Preliminary Report on Patentability, PCT/US2007/026253, Jun. 30, 2009 [practitioner's file 2906/120WO].

Office Action dated Jul. 24, 2009 in U.S. Appl. No. 12/004,780 [practitioner's file 2906/120].

The Patent Office of the People's Republic of China, Notification of the First Office Action, Appl. No. 200680034968.X, Sep. 25, 2009.

Supplementary European Search Report, App. No. EP06803925.4, Sep. 29, 2009.

Notification of the First Office Action (PCT Application in the National Phase); Application No. 200680034968.

\* cited by examiner

RADIATION SENSOR DEVICE AND METHOD

RELATED APPLICATIONS

This application claims benefit of U.S. Provisional Application No. 60/719,127 filed on Sep. 21, 2005. This application is incorporated herein by this reference.

FIELD OF THE INVENTION

This invention relates to an improved radiation sensor device and method using industry standard package outlines.

BACKGROUND OF THE INVENTION

Conventional radiation sensor devices such as infrared (IR) sensors include an infra-red sensing element micro-machined in the active surface of an integrated circuit chip and mounted in a windowed metal cap whose window allows the sensor to be exposed to IR radiation to be sensed. While this approach is satisfactory it is also quite expensive. Conventional integrated circuit packaging employs a lead frame which together with the integrated circuit chip is encapsulated in epoxy, e.g. Sumitomo G700. The lead frame typically includes a paddle supporting the integrated circuit chip and leads for receiving wire bonds for the integrated circuit chip. This is less expensive than the packaging used in conventional radiation sensing devices, but the plastic is generally not transparent to the radiation to be sensed, e.g., infrared and so is unsuitable for use with integrated circuit chips which have radiation sensors.

SUMMARY OF THE INVENTION

It is therefore an object of this invention to provide an improved radiation sensor device and method of making it.

It is therefore an object of this invention to provide an improved packaging approach for a radiation sensor device.

It is therefore an object of this invention to provide an improved packaging approach which utilizes industry-standard package outlines and avoids the need for custom packages.

It is therefore an object of this invention to provide an improved packaging approach which is simple yet effective and inexpensive.

It is therefore an object of this invention to provide such an improved radiation sensor device and method which overcomes mold bleed.

It is therefore an object of this invention to provide such an improved radiation sensor device and method which is useable with pre-molded packages.

It is therefore an object of this invention to provide an improved packaging approach which results in more efficient radiation sensing.

It is therefore an object of this invention to provide an improved packaging approach which can employ a lens to enhance the effectiveness of radiation sensing.

The invention results from the realization that an improved radiation sensing device and package which can use industry-standard packaging outlines and produce enhanced operation, can be achieved by attaching a cap to an integrated circuit chip, having a radiation sensor on a surface of the said chip, with the cap spaced from and covering the radiation sensor, at least one of the cap and integrated circuit chip having at least a portion proximate the radiation sensor transparent to the radiation to be sensed.

The subject invention, however, in other embodiments, need not achieve all these objectives and the claims hereof should not be limited to structures or methods capable of achieving these objectives.

This invention features a radiation sensor device including an integrated circuit chip with an integral radiation sensor on a surface of the integrated circuit chip. A cap is attached to the integrated circuit chip and spaced from and covering the radiation sensor. At least one of the cap and integrated circuit chip have at least a portion proximate the radiation sensor which is transparent to the radiation to be sensed.

In a preferred embodiment the radiation sensor may be on the active surface of the integrated circuit chip and the cap may include a radiation transparent portion. The radiation sensor may be on the inactive surface of the integrated circuit chip and the integrated circuit chip may include a radiation transparent portion. The integrated circuit chip may include solder bump connections on its active surface or on its inactive surface. The cap and the integrated circuit chip with the radiation sensor may be disposed in an encapsulant with the inactive surface exposed at a boundary of the encapsulant. At least a portion of the integrated circuit proximate the radiation sensor may be transparent to the radiation to be sensed. The cap and the integrated circuit chip with the radiation sensor may be disposed in an encapsulant with the cap exposed at the boundary of the encapsulant. At least a portion of the cap proximate the radiation sensor may be transparent to the radiation being sensed. The cap and integrated circuit chip with the radiation sensor may be disposed in an encapsulant along with the lead frame. The lead frame may include an exposed paddle or a hidden paddle. The integrated circuit chip may be flip chip attached to the lead frame. The cap and the integrated circuit chip with the radiation sensor may be disposed in an encapsulant. The encapsulant may include a recess. The cap may be exposed in the recess. The integrated circuit chip may be exposed in the recess. There may be a pre-molded package with a base for supporting the cap and the integrated circuit chip with the radiation sensor. The pre-molded package may be filled with an encapsulant up to and not covering the cap. There may be a lid above the cap having at least a portion transparent to the radiation to be sensed. The sensor may be an infrared radiation sensor. The transparent portion may be transparent to infrared radiation. The cap may provide a vacuum at the radiation sensor. The cap may include a lens. The encapsulant may be plastic. The encapsulant may be epoxy.

This invention also features a radiation sensor device including an integrated circuit chip with an integral radiation sensor on a surface of the integrated circuit chip. A cap is attached to the integrated circuit chip and spaced from and covering the radiation sensor. At least one of the cap and integrated circuit chip have at least a portion proximate the radiation sensor which is transparent to the radiation to be sensed. There is an encapsulant encapsulating the cap and the integrated circuit chip with radiation sensor with a transparent portion exposed at a boundary of the encapsulant.

In a preferred embodiment the encapsulant may include plastic.

The invention also features a method of forming a radiation sensor device including attaching a cap to an integrated circuit chip having a radiation sensor on its surface, with the cap spaced from and covering the radiation sensor. The method also includes encapsulating the cap and integrated circuit chip with the radiation sensor in an encapsulant with a transparent portion of at least one of the cap and integrated circuit chip proximate the radiation sensor being exposed at the boundary of the encapsulant.

In a preferred embodiment the encapsulant may include a plastic. The vacuum may be formed about the radiation sensor in the cap. A sacrificial layer may be formed over a transparent portion and etched away to remove any mold bleed occurring at the transparent portion. There may be a compliant layer to prevent mold bleed at and protect the transparent portion. The complaint layer may be peripheral with a void.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
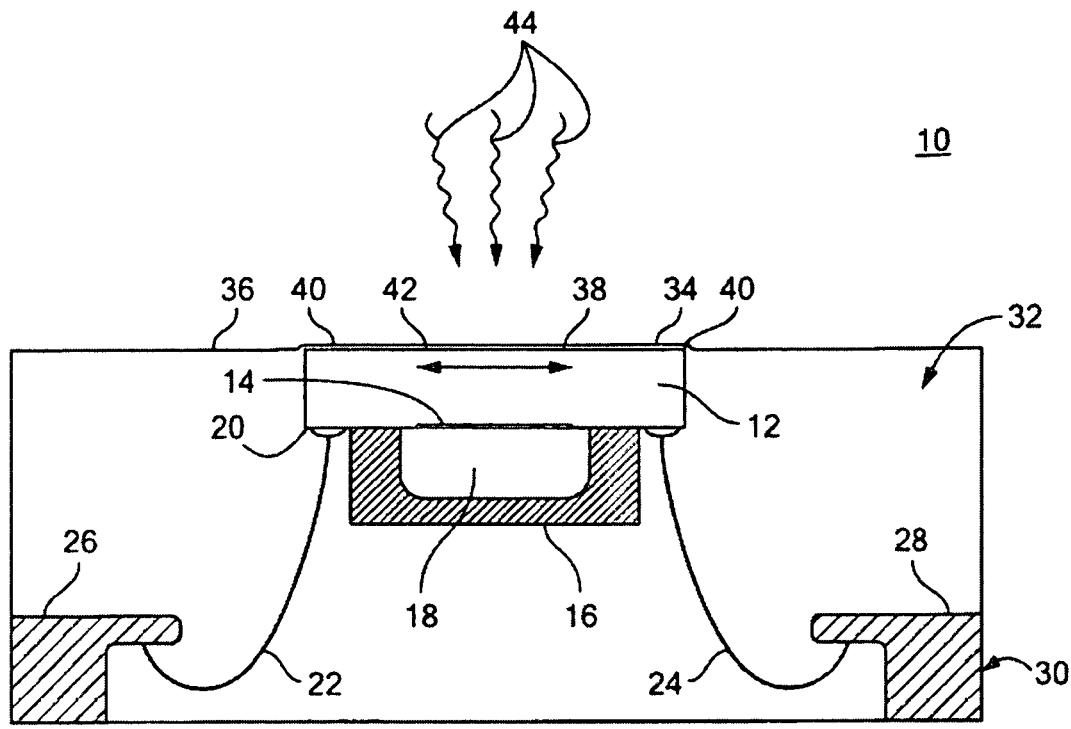
FIG. 1 is a schematic side sectional diagram of an improved integrated circuit chip radiation sensor package using an encapsulant with the radiation sensor on the active surface sensing through the exposed inactive surface of the IC, according to this invention.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

There is shown in FIG. 1 an improved radiation sensor device 10 according to this invention including an integrated circuit chip 12 and radiation sensor 14. Radiation sensor 14 may be an infrared sensor formed by micromachining on the surface of integrated circuit chip 12. This technique is well known as taught in the article "A batch-fabricated silicon thermopile infrared detector" by G. R. Lahiji, K. D. Wise, IEEE Trans' on Electron Devices, 1982 which is incorporated herein in its entirety by this reference. Cap 16 is attached to integrated circuit chip 12 using an adhesive such as Ferro 11-036 available from Ferro Corporation, Cleveland, Ohio, USA taught in U.S. Pat. No. 6,893,574 which is incorporated herein in its entirety by this reference. Cap 16 protects radiation sensor 14 from handling and environmental damage. It may also create in space 18 a vacuum which enhances the transmission of radiative heat energy by minimizing convective and conductive heat transfer, which results in an improved efficiency for the radiation sensor, especially when the radiation sensor is, for example, an infrared sensor. Radiation sensor 14 is on the active surface 20 of integrated circuit chip 12. Wires 22 and 24 interconnect the active surface 20 of integrated circuit chip 12 to leads 26 and 28 of lead frame 30.

In accordance with this invention the entire assembly of lead frame 30, cap 16, and integrated circuit chip 12 with radiation sensor 14 is encapsulated in an encapsulant 32 which may be plastic, epoxy, or some other material, for example, Sumitomo G700 available from Sumitomo Bakelite Co. Ltd, Japan. The inactive surface 34 of integrated circuit chip 12 is exposed at boundary 36 of the encapsulant 32. Assuming radiation sensor is an infrared sensor chip 12 may be formed to have at least a portion 38 of it transparent to the infrared radiation. This can be done by making that a portion of the integrated circuit chip material out of silicon or by making the whole substrate of the integrated circuit chip from silicon which is transparent to infrared radiation. If other types of radiation are used, for example, visible radiation, the transparent medium would not be silicon, e.g. a glass or silicon dioxide material.

Figure 1A:
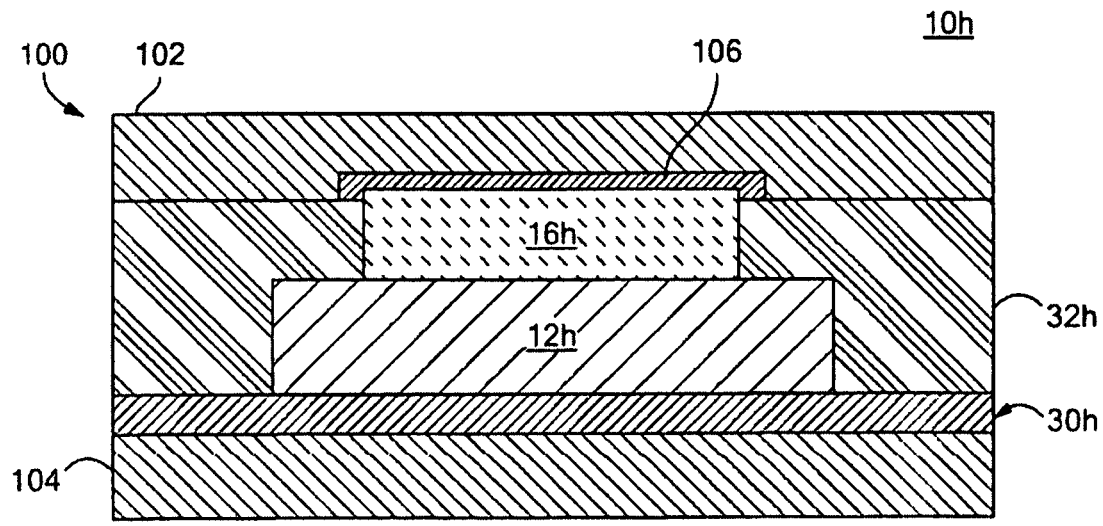
FIGS. 1A and 1B are side elevational views showing a compliant mold insert used instead of the sacrificial layer in FIG. 1.
Figure 1B:
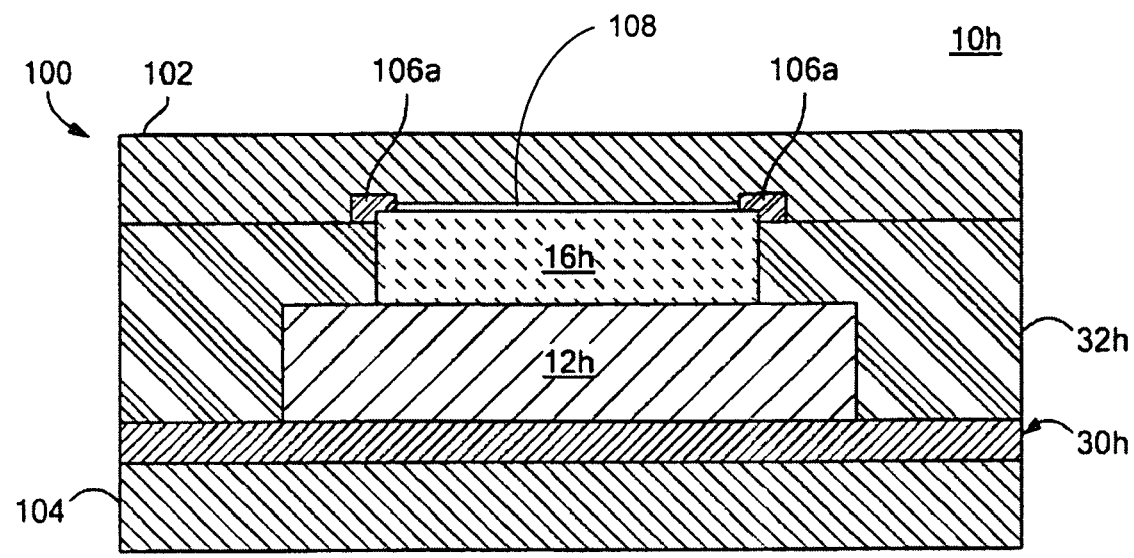

Often during the encapsulation process some of the encapsulant 32 may bleed 40 over the transparent portion 38. To overcome this problem and to protect the cap surface against mechanical damage from contact with the hard surface of the mold, there may be a sacrificial layer 42 deposited on the inactive surface 34 of integrated circuit chip 12 before the encapsulation. This can be a water soluble material such as Concoat CM553 available from Concoat Ltd, Surrey, England which can be washed away taking with it the mold bleed 40 and leaving the exposed inactive surface 34 clear. A further method of overcoming these problems is to use a mold with a 'soft' surface in contact with the cap. This would deform slightly over the cap, preventing mechanical contact damage and any resin flash. This alternative is shown in FIG. 1A where conventional mold cavity 100, having upper and lower mold cavities 102, 104, FIG. 1A, is modified to accept a compliant insert 106, e.g., a rubber coated insert made by ASM International NV, Bilthoven, Netherlands, which would be replaced after a certain number of cycles. The purpose of this insert is to ensure a compression seal between the insert 106 and surface of the cap 16h, sufficient to prevent the ingress of molding material that would affect the transmission of IR radiation through the cap. The insert may be replaced after a certain number of cycles. Alternatively, insert 106 may be replaced with a peripheral insert 106a, FIG. 1B, with a void 108. In operation, referring again to FIG. 1, infrared radiation 44 passes through the transparent portion 38 of integrated circuit chip 12 to strike the infrared sensor 14. Infrared radiation coming from the other direction, that is, attempting to reach infrared sensor 14 through cap 16 would be prevented by the encapsulant 32.

Figure 2:
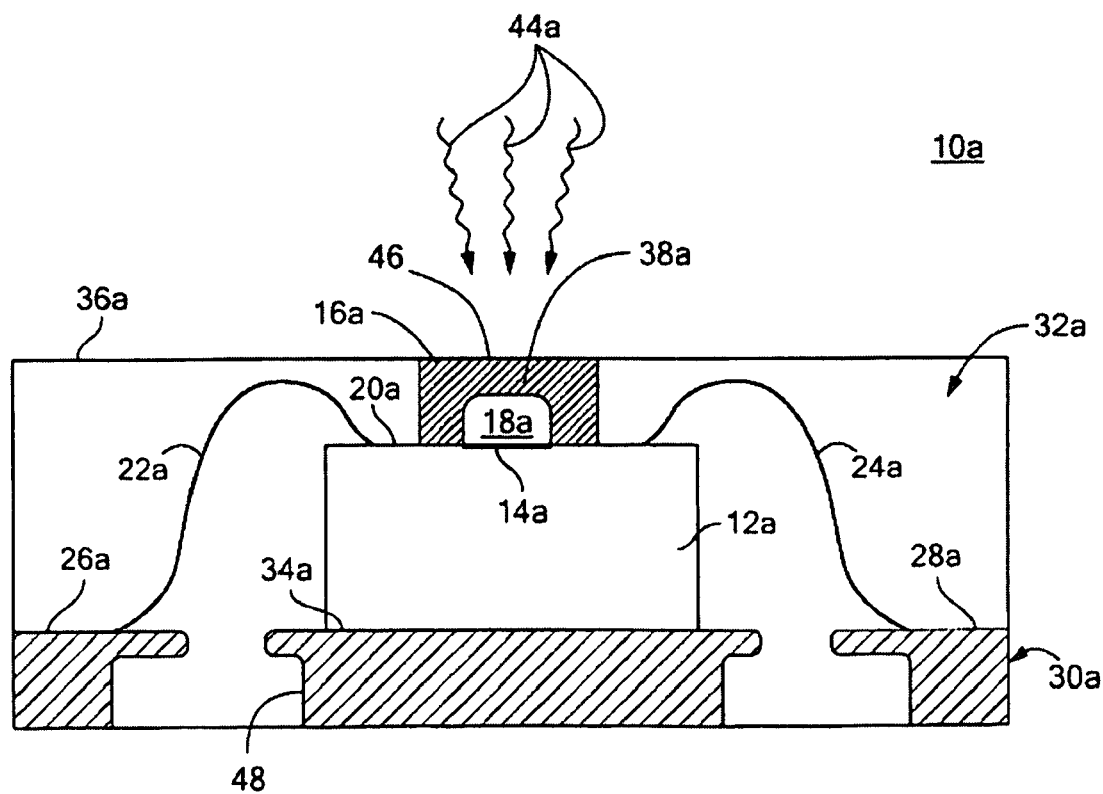
FIG. 2 is a view similar to FIG. 1 but with the radiation sensor on the active surface sensing through the exposed cap.

In another construction, FIG. 2, radiation sensor device 10a places a face 46 of cap 16a at the boundary 36a of encapsulant 32a. Cap 16a then includes a transparent portion 38a which, for example, in one embodiment would be transparent to infrared radiation 44a. The radiation 44a would then pass through transparent portion 38a and vacuum 18a to the radiation sensor 14a at the active surface 20a of integrated circuit chip 12a. The inactive surface 34a of integrated circuit chip 12a is here shown on paddle 48 which forms a part of lead frame 30a, along with leads 26a and 28a.

Figure 3:
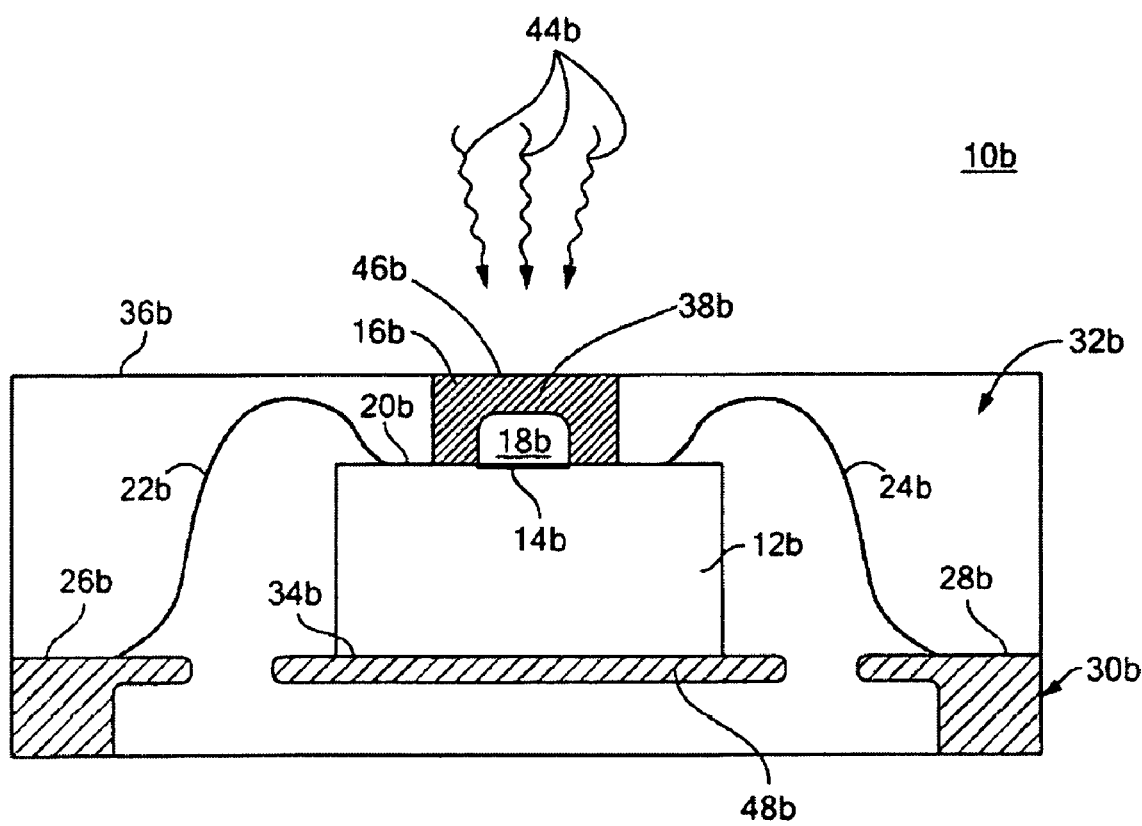
FIG. 3 is a view similar to FIG. 2 but using a half-etched paddle in the lead frame.
Figure 3A:
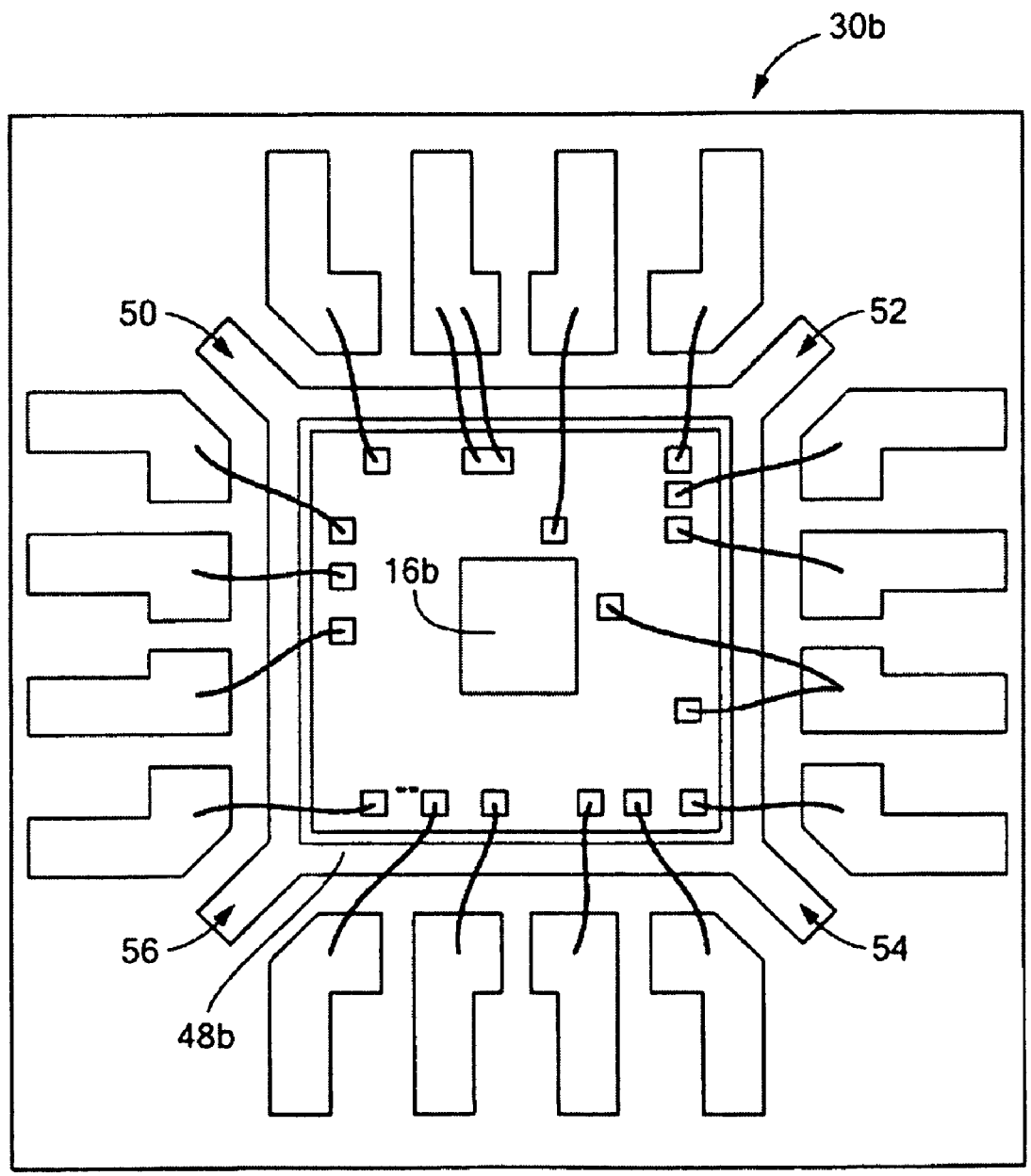
FIG. 3A is a top plan view of FIG. 3 showing the suspension of the half-etched paddle.

Alternatively, in sensor device 10b, FIG. 3, exposed or full paddle 48 may be replaced by hidden or half etched paddle 48b which is suspended on spring like support elements 50, 52, 54, and 56, FIG. 3A, from the corners of lead frame 30b to provide a biasing force that keeps the face 46b of cap 16b against the boundary 36b of the encapsulant and mold during the encapsulation procedure.

Figure 4:
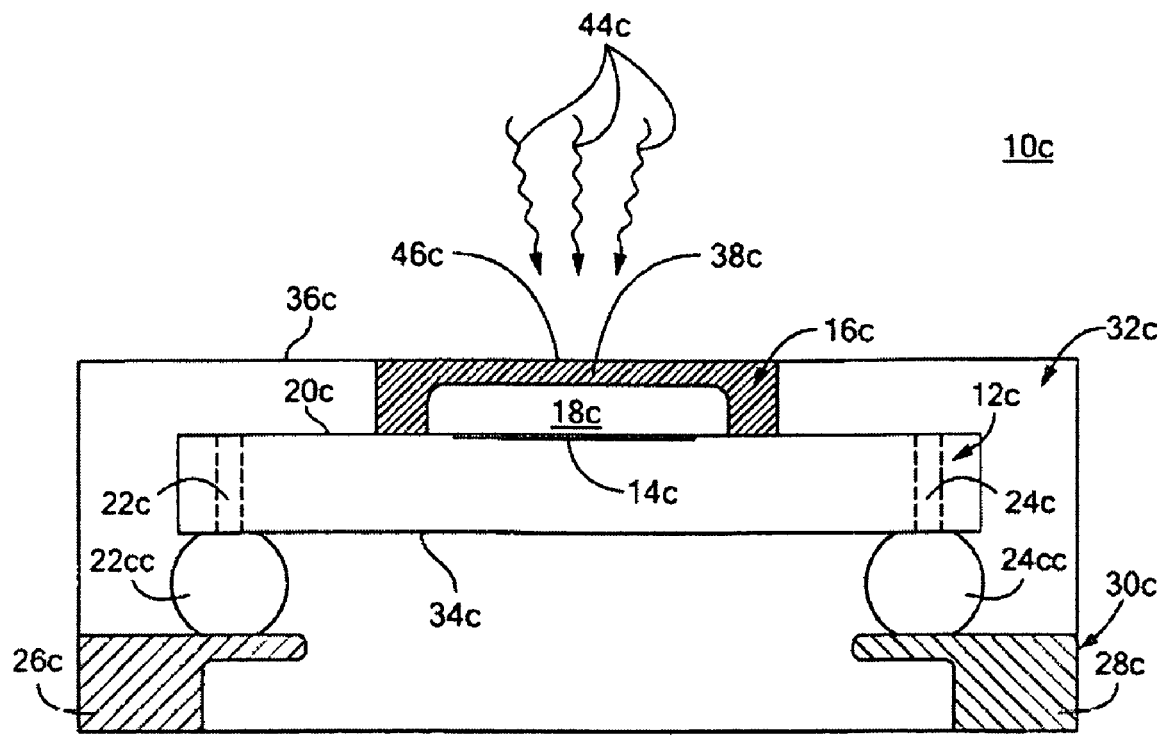
FIG. 4 is a view similar to FIG. 2 but with the active surface connected by vias and solder bumps to the leads of the lead frame.

In sensor device 10c, FIG. 4, wire leads 22, 24, 22a, 24a, 22b, 24b, of FIGS. 1, 2, and 3 respectively, are replaced by vias 22c, and 24c and flip chip solder bumps 22cc and 24cc which interconnect the active surface 20c to leads 26c and 28c of lead frame 30c. Once again radiation 44c, which may be infrared radiation penetrates a transparent portion 38c of cap 16c whose surface 46c is revealed at boundary 36c of encapsulant 32c. It then passes through the volume 18c, which contains a vacuum, to reach radiation sensor 14c.

Figure 5:
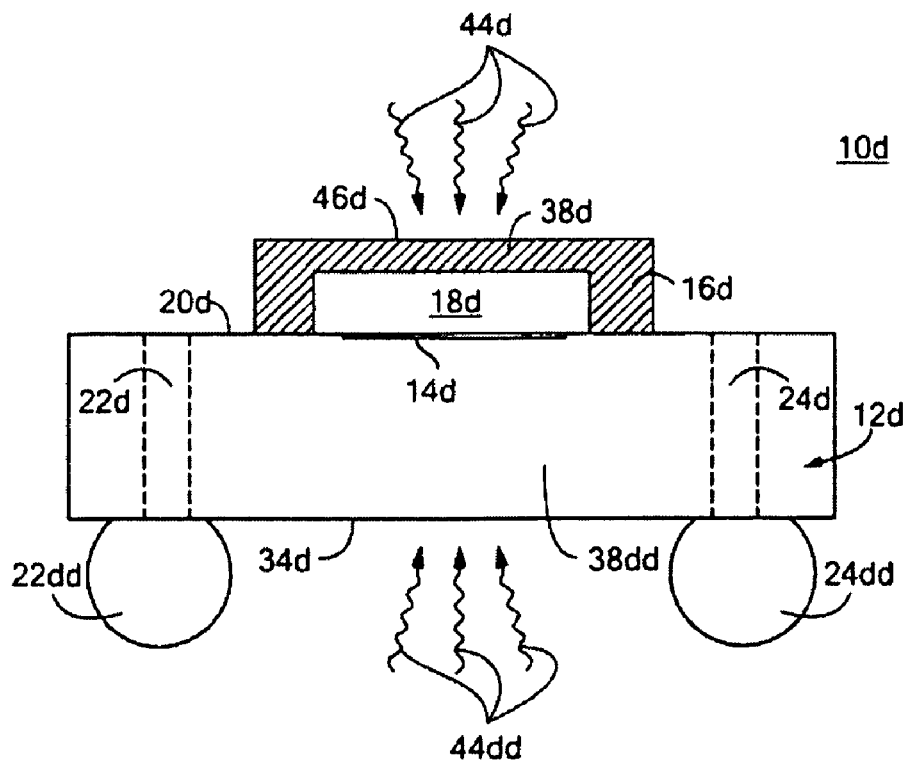
FIG. 5 is a schematic side sectional diagram of an improved integrated circuit chip radiation sensor package unencapsulated and with the active surface connected through vias to solder bumps.
Figure 6:
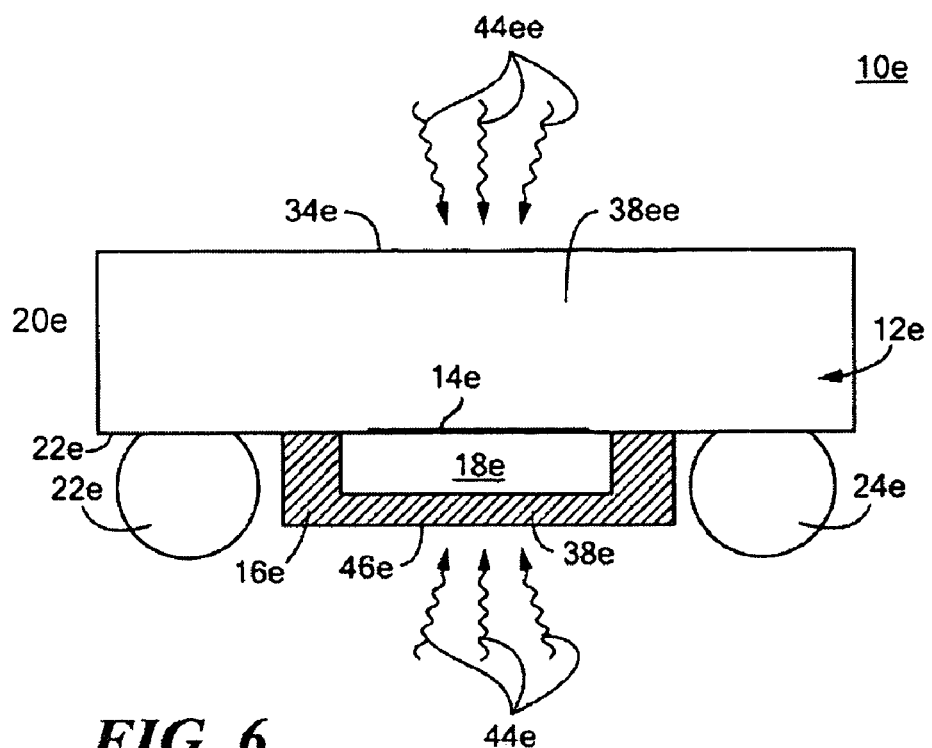
FIG. 6 is a view similar to FIG. 5 with the active surface connected directly to the solder bumps and illustrating mounting on a circuit board with an aperture or window proximate the cap and radiation sensor.

In a another embodiment the radiation sensor device 10d, FIG. 5, employs integrated circuit chip 12d which carries radiation sensor 14d which is protected by cap 16d attached to integrated circuit chip 12d and covering radiation sensor 14d to form volume 18d which contains a vacuum. There is no encapsulant included in this embodiment. Electrical connection is made through vias 22d, 24d and flip chip solder bumps 22dd and 24dd from the active surface 20d of integrated circuit chip 12d. Here radiation 44d may enter through transparent portion 38d of cap 16d then pass through volume or vacuum 18d to radiation sensor 14d. Alternatively, or in addition, radiation 44dd may pass through transparent portion 38dd of integrated circuit chip 12d. If required, radiation may be prevented from passing through some or all of the surfaces of 12d by means of a coating. Alternatively, integrated circuit chip 12e, in sensor device 10e, FIG. 6, can be flipped so that active surface 20e is on the bottom and connects directly to solder balls or bumps 22e, 24e. In that case radiation 44e can pass through transparent portion 38e at surface 46e of cap 16e then through volume 18e to radiation sensor 14e and/or may penetrate from the inactive surface as through transparent portion 38ee of integrated circuit chip 12e as does radiation 44ee.

Figure 7:
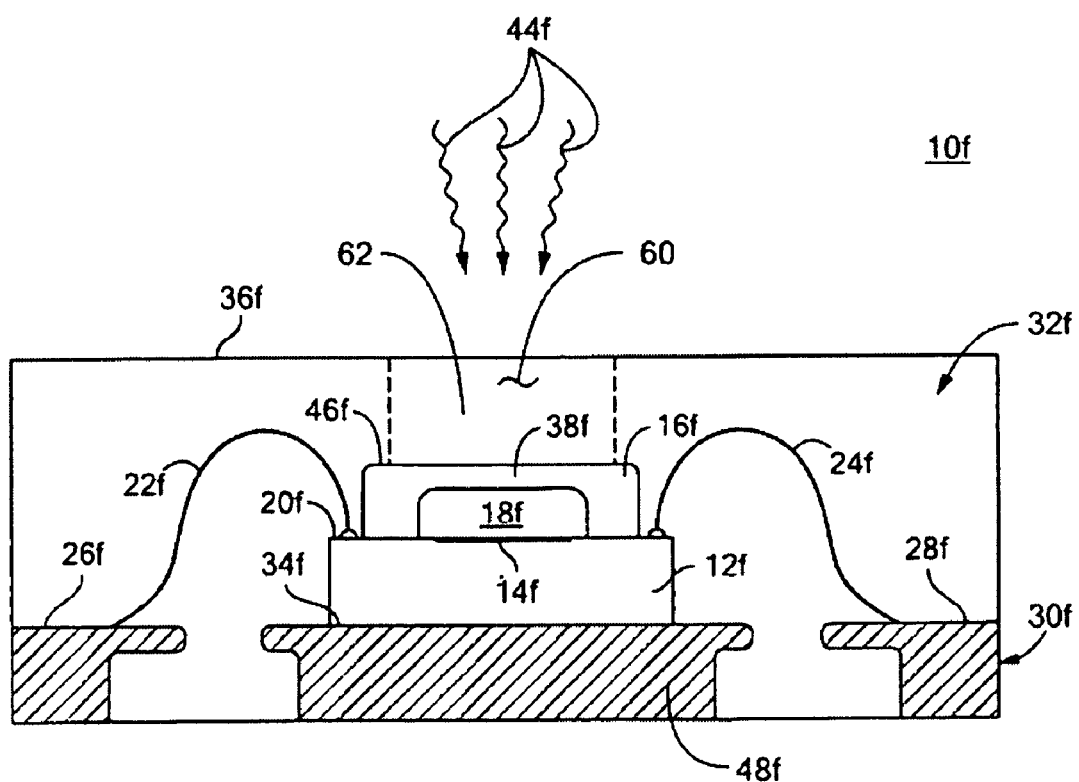
FIG. 7 is a view similar to FIG. 2 with a hole in the encapsulant above the cap.

In another construction, device 10f, FIG. 7, may include an opening 60 in encapsulant 32f above cap 16f so that radiation 44f can pass through to transparent portion 38f, then through volume 18f to radiation sensor 14f. Opening 60 could be filled with a material 62 which is transparent to radiation 44f. For example, if radiation 44f were infrared radiation then opening 60 could be left empty or filled with an infrared transparent material 62 such as silicon.

Figure 8:
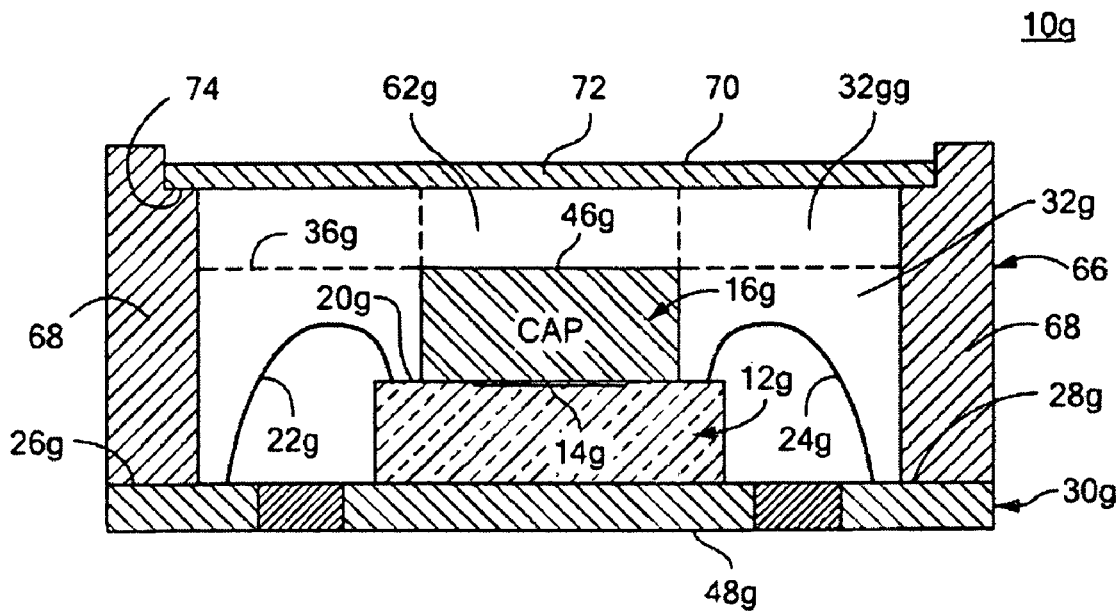
FIG. 8 is a schematic block diagram of a pre-molded package according to this invention.

In yet another embodiment of device 10g, FIG. 8, integrated circuit chip 12g and cap 16g may be mounted in a conventional pre-molded package 66 including base 30g with leads 26g and 28g and paddle 48g and wall or walls 68. An encapsulant 32g may then be added up to but typically no farther than the face 46g so that the boundary 36g of the encapsulant 32g is coincident with face 46g or below it. Or the encapsulant may be filled to the top as shown as 32gg but leaving a hole 62g which may be open or filled with a transparent medium. A lid 70 may also be employed with a transparent portion 72. It would be attached at 74 to wall or walls 68 using an adhesive such as Ablestik 84-3J available from Ablestik Inc, Rancho Dominguez, Calif., USA.

Figure 9:
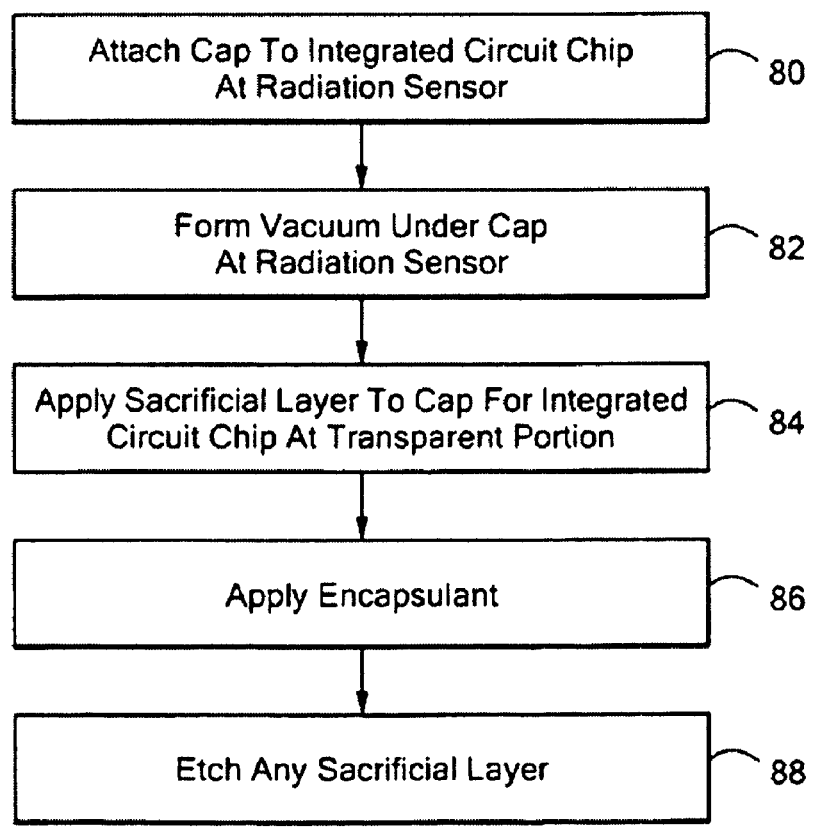
FIG. 9 is a block diagram of a method of making a radiation sensor device in a package according to this invention.

The method of making a radiation sensor device according to this invention includes attaching a cap to the integrated circuit chip at the radiation sensor 80, FIG. 9. In a preferred embodiment a vacuum may be formed under the cap at the radiation sensor 82. Also in a preferred embodiment a sacrificial layer such as Concoat CM553 may be applied to the cap or the integrated circuit chip at the transparent portion 84. After that the encapsulant is applied 86 and any sacrificial layer is removed 88. A further variation on this is the use of a mould with a compliant surface. The leadframe and die are located in the mould such that the surface of the cap to be exposed is pressed against the compliant surface. This prevents mould flash from reaching the exposed cap surface.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A radiation sensor device comprising:
    an integrated circuit chip including a radiation sensor on a surface of said integrated circuit chip; and
    a cap attached to said integrated circuit chip spaced from and covering said radiation sensor, at least one of said cap and said integrated circuit chip having at least a portion proximate said radiation sensor transparent to the radiation to be sensed, in which said cap and integrated circuit chip with said radiation sensor are disposed in an encapsulant, wherein the encapsulant includes a recess, and wherein the transparent portion is exposed in the recess.

2. The radiation sensor device of claim 1 further comprising a lead frame disposed in the encapsulant.

3. The radiation sensor device of claim 2 in which said lead frame includes an exposed paddle.

4. The radiation sensor device of claim 2 in which said lead frame includes a hidden paddle.

5. The radiation sensor device of claim 2 in which said integrated circuit chip is flip-chip attached to said lead frame.

6. The radiation sensor device of claim 1, further comprising solder bump connectors on an active surface of the integrated circuit chip.

7. The radiation sensor device of claim 1, further comprising solder bump connectors on an inactive surface of the integrated circuit chip.

8. The radiation sensor device of claim 1 in which said cap is exposed in said recess.

9. The radiation sensor device of claim 1 in which said integrated circuit chip is exposed in said recess.

10. The radiation sensor device of claim 1 in which said encapsulant includes plastic.

11. The radiation sensor device of claim 1 in which said encapsulant includes epoxy.

12. A radiation sensor device comprising:
an integrated circuit chip including a radiation sensor on a surface of said integrated circuit chip and solder bump connectors configured to provide a connection to an active surface of the integrated circuit chip and for mounting the integrated circuit chip on at least one of leads and a circuit board;
a cap attached to said integrated circuit chip spaced from and covering said radiation sensor, at least one of said cap and said integrated circuit chip having at least a portion proximate said radiation sensor transparent to the radiation to be sensed;
and an encapsulant encapsulating said cap and said integrated circuit chip with radiation sensor with a said cap exposed at a boundary of said encapsulant.

13. The radiation sensor device of claim 12, in which the solder bump connectors are on an active surface of the integrated circuit chip.

14. The radiation sensor device of claim 12 in which said encapsulant includes plastic.

15. The radiation sensor device of claim 12, in which the solder bump connectors are on an inactive surface of the integrated circuit chip.

16. The radiation sensor device of claim 12 further comprising a lead frame disposed in the encapsulant.

17. The radiation sensor device of claim 16, wherein the lead frame includes an exposed paddle.

18. The radiation sensor device of claim 16, wherein the lead frame includes a hidden paddle.

19. The radiation sensor device of claim 16, wherein the integrated circuit chip is flip-chip attached to the lead frame.

20. A method of forming a radiation sensor device comprising:
attaching a cap to an integrated circuit chip, the integrated circuit chip having a radiation sensor on a surface and solder bump connectors configured to provide a connection to an active surface of the integrated circuit chip and for mounting the integrated circuit chip on at least one of leads and a circuit board, with the cap spaced from and covering said radiation sensor;
and encapsulating said cap and integrated circuit chip with said radiation sensor in an encapsulant with a transparent portion of said cap proximate said radiation sensor being exposed at the boundary of said encapsulant.

21. The method of claim 20 in which said encapsulant includes a plastic.

22. The method of claim 20 in which a vacuum is formed about said radiation sensor in said cap.

23. The method of claim 20 in which a sacrificial layer is formed over a transparent portion and etched away to remove any mold bleed occurring at the transparent portion.

24. The method of claim 23 wherein the sacrificial layer comprises a water soluble material.

25. The method of claim 20 in which a compliant layer is formed over a transparent portion to prevent mold bleed occurring at the transparent portion and protect the transparent portion.

26. The method of claim 25 in which a compliant layer includes a void.

27. The method of claim 25 wherein the compliant layer comprises a removable compliant insert.

28. The method of claim 25, wherein the compliant layer contacts the cap at the periphery of the transparent portion.

* * * * *